United States Patent [19]
Lasier et al.

[11] Patent Number: 4,631,819
[45] Date of Patent: Dec. 30, 1986

[54] LOW STRESS, TOLERANCE FREE METHOD FOR MOUNTING POWER DEVICES

[75] Inventors: David D. Lasier, Arlington Heights; John L. Meyer, Lake in the Hills; Michael Sweda, Mt. Prospect, all of Ill.

[73] Assignee: Motorola, Inc., Schaumburg, Ill.

[21] Appl. No.: 738,638

[22] Filed: May 29, 1985

[51] Int. Cl.⁴ .............................................. H05K 3/39
[52] U.S. Cl. ................................. 29/840; 174/16 HS; 357/80; 361/386
[58] Field of Search ............... 29/837, 411, 840, 412, 29/589, 413, 838; 357/81, 80; 361/386; 174/16 HS

[56] References Cited

U.S. PATENT DOCUMENTS

| | | | |
|---|---|---|---|
| 3,641,474 | 2/1972 | Owens | 339/17 L |
| 3,786,317 | 1/1974 | Thierfelder | 357/72 |
| 4,012,765 | 3/1977 | Lehner et al. | 357/70 |
| 4,190,735 | 2/1980 | Checki, Jr. | 174/52 FP |
| 4,204,248 | 5/1980 | Proffit et al. | 361/388 |
| 4,343,084 | 8/1982 | Wilmarth | 29/843 |
| 4,344,106 | 8/1982 | West et al. | 361/386 |
| 4,387,413 | 6/1983 | Griffis | 361/386 |
| 4,389,697 | 6/1983 | Bell et al. | 361/380 |

Primary Examiner—Mark Rosenbaum
Assistant Examiner—Carl J. Arbes
Attorney, Agent, or Firm—Donald B. Southard; Thomas G. Berry

[57] ABSTRACT

A low stress, tolerance free method for mounting a power device to a heat sink is disclosed. The power device is soldered into a break-away area created on a printed circuit (PC) board which is separated from the main PC board prior to final assembly. The main PC board may be mounted in a housing using any suitable means and the power device may be affixed to a heat sink regardless of tolerance build up so long as sufficient "travel" is created in the jumper wires which couple the break-away PC board to the main PC board.

9 Claims, 4 Drawing Figures

U.S. Patent     Dec. 30, 1986     4,631,819
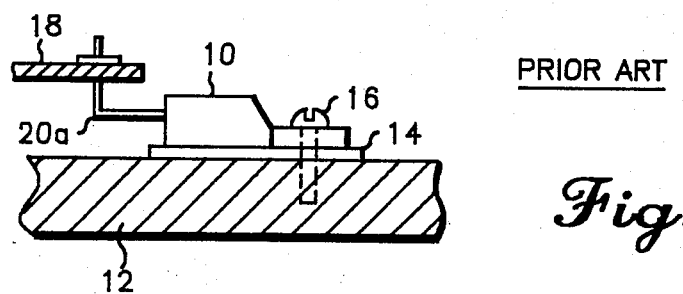
PRIOR ART
Fig. 1
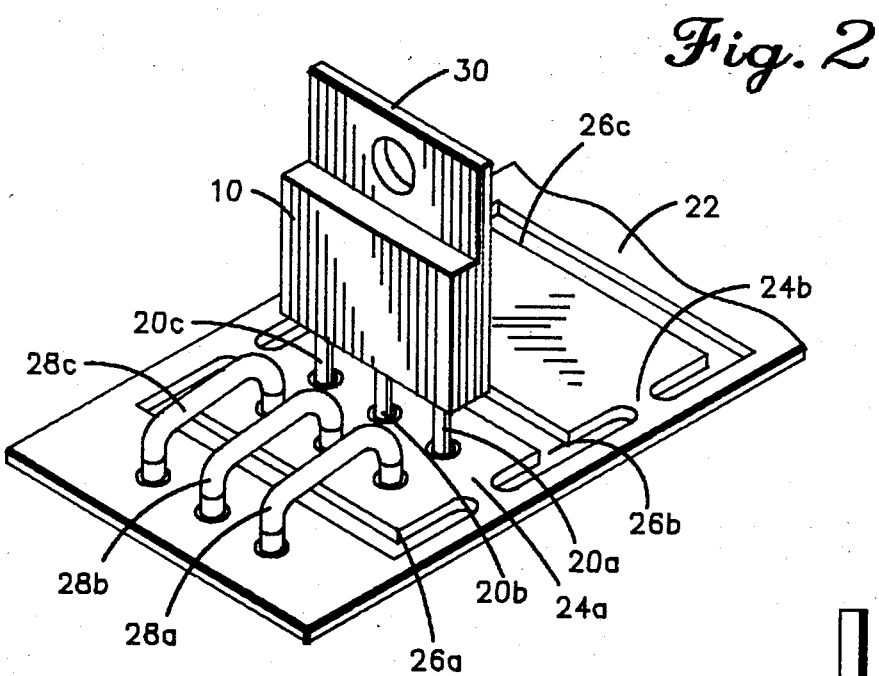
Fig. 2
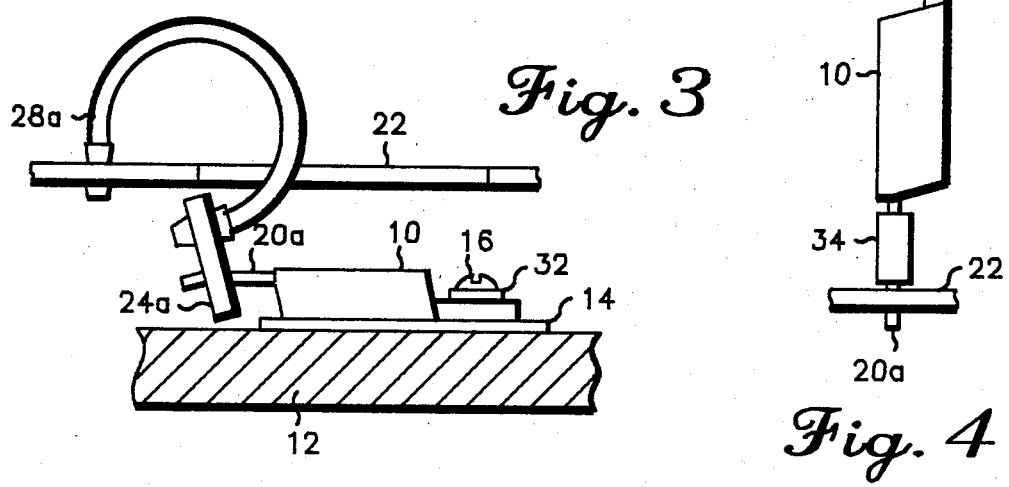
Fig. 3
Fig. 4

LOW STRESS, TOLERANCE FREE METHOD FOR MOUNTING POWER DEVICES

BACKGROUND OF THE INVENTION

The present invention relates generally to mounting methods and more particularly to a method for mounting power devices that are heat sinked to a chassis or housing.

Those skilled in manufacturing techniques can appreciate the significant problems encountered when trying to align a power device to a heat sink in a housing. Several critical factors must be controlled to ensure proper alignment of the power device to the mounting hole or position on the heat sink. The paramount alignment factors include the height of the device above the printed circuit (PC) board, the alignment of the PC board within the housing, and the registration of the mounting location on the heat sink. While each of the individual parameters may be within a specified tolerance, when assembled, the tolerance buildup results in non-alignment of the power device and the mounting location. Clearly, the alignment problem is multiplied if multiple power devices require mounting in a common housing.

The alignment problem cannot be corrected by placing more stringent specifications on the individual parts since this will generally increase the cost of the individual parts, and thus the entire assembly, such that their use becomes cost prohibitive. Alternately, some process control engineers have elected to mount the power device as an individual component at the final assembly stage of the manufacturing process. Generally, this technique succeeds in removing the height of the part above the PC board parameter, however, does not improve the alignment of the PC board in the housing or the registration of the mounting location on the heat sink.

Typically, the PC board would be mounted into the housing and the power device manually arranged until alignment was satisfactory after which the device would be affixed to the heat sink. In addition to being laborious, this technique places physical stresses on the terminal leads of the power device as it is "force fitted" into alignment. Those skilled in the art will appreciate that physical stresses on terminal leads may affect the internal bonding of a device and hence shorten the device lifetime. Thus, a need exists to find a method for mounting power devices to a heat sink that eliminates the aforedescribed tolerance and stress problems encountered when trying to mount a power device to a heat sink.

SUMMARY OF THE INVENTION

Accordingly, it is an object of the present invention to provide a mounting method that alleviates the aforedescribed deficiencies in prior art mounting techniques.

It is a more specific object of the present invention to alleviate the aforedescribed prior art deficiencies while allowing the power device to be installed in the PC board prior to final assembly.

Accordingly, these and other objects are achieved in the present inventive method for mounting power devices.

In practicing the invention, a break-away area is created in the PC board that the power device will be mounted on. Generally, the device is "wave-lined" in the typical mass production process. At the final assembly stage, the power device mounted in the break-away area is physically detached from the main PC board but remains electrically coupled to the main PC board via jumper wires. The PC board is then mounted into the housing by any suitable means as is known in the art. The break-away board containing the power device may now be easily aligned to the mounting area of the heat sink provided the jumper wires are of sufficient length to allow an appropriate amount of "travel". Thus, critical control of the aforementioned parameters is not required since the travel afforded by the jumper wires amply corrects for all of the tolerance build up while contemporaneously allowing a connection that does not physical stress the power device.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like referenced numerals identify like elements, and in which:

FIG. 1 is a side-view in partial cross-section of a typical power device mounted in accordance with the prior art;

FIG. 2 is a view in perspective showing the mounting arrangement in accordance with the present invention prior to separation from the main PC board;

FIG. 3 is a side-view in partial cross-section of the mounting arrangement of FIG. 2 with the power device attached to the heat sink;

FIG. 4 is a side-view of the power device of FIGS. 2 and 3 illustrating an optional step in accordance with the present invention.

DESCRIPTION OF THE PRIOR ART

Referring now to FIG. 1, a typical mounting arrangement for a power device or the like in accordance with the prior art is shown. Generally, the power device 10 is attached to the heat sink 12 of the housing (not shown) to allow thermal transfer from the power device to the heat sink as is well known in the art. Generally, the power device 10 must be insulated from the heat sink 12 via an insulating layer 14 which is typically a thermally conductive silicone layer.

The first step of the mounting method may be to attach the power device 10 (including insulating layer 14) to the heat sink 12 using a screw 16 or other suitable fastening means. The PC board would then be mounted within the housing such that the terminal leads 20a (only one lead shown in side view) protrude through the PC board 18 whereafter electrical connection may be established by soldering or suitable equivalent. This process is generally performed manually at the final assembly stage and is laborious in nature and prone to physically stressing the power device 10 through the terminal leads. Accordingly, this technique generally results in lower productivity and decreased reliability.

DETAILED DESCRIPTION OF THE PREFERRED EMBODIMENT

Referring now to FIG. 2, the preferred mounting arrangement for mounting a power device to the PC board is shown. The PC board 22 has break-away areas 24a and 24b defined by the slots 26a–c in the PC board 22. Techniques for creating break-away areas in PC boards are well known and any technique that creates an appropriately sized break-away area, regardless of the actual geometric pattern, is suitable in accordance with the present invention.

The power device 10 is positioned either manually or using automatic equipment in the break-away area 24a and is coupled to the main PC board 22 via wire jumpers 28a–c. Generally, the power device 10 can be any device that requires heat sinking through a heat sink tab 30. Such devices include, but are not limited to, voltage regulators, audio power amplifiers, power transistors, silicon controlled rectifiers (SCR's) and power diode rectifiers all manufactured by Motorola, Inc. Further, although FIG. 2 graphically illustrates a power device 10 having three terminal leads 28a–c, it will be understood that a device having any number of leads may be mounted using this technique without departing from the teachings of the present invention.

The power device 10 and the jumper wires 28a–c are usually inserted in the PC board 22 prior to any manual or automated soldering step. Generally, in a mass produced PC board, components are inserted into a bare PC board either manually or through an automated process and sent over a "wave-line" which solders all components to the PC board 22 in one step. The wave-solder process is generally preferred both for speed and for the uniform connections established. After proceeding through any intermediate steps or assembly procedures that may be required, the PC board 22 containing the power device 10 is routed to the final assembly stage where it may be mounted into a housing.

Referring now to FIG. 3, taken in conjunction with FIG. 2, the mounting technique of the present invention is shown. Prior to mounting the PC board 22 into a housing, the break-away areas 24a and 24b are separated from the main PC board 22 either by hand (provided the "tabs" created by the slots 26a–c are small enough to allow hand removal) or by using an appropriate tool. The break-away area 24b may be discarded since the device 10 is not connected to the break-away area 24b, the main purpose of which is to provide an opening large enough for the power device 10 and the break-away area 24a. The jumper wires 28a–c allow the break-away PC board 24a to be moved freely about for alignment with the heat sink 12. Generally, a thermally conductive insulating pad 14 consisting essentially of silicone is placed between the power device 10 and the heat sink 12 as is well known in the art. After alignment, the power device 10 is secured to the heat sink 12 via a fastening screw 16 which may also be insulated from the heat sink 12 by an insulating washer 32. Alternately, the power device 10 may be secured using an bolt, rivit or suitable equivalent.

The exact height of the power device 10 above the PC board 22 is not critical, nor is the exact positioning of the PC board 22 within the housing since the wire jumpers 28a–c provide sufficient "travel" to allow the power device 10 to be aligned without physically stressing the power device 10. Accordingly, the present invention method allows the power device 10 to be assembled early in the manufaccturing process providing increased productivity, decreased assembly cost and a more reliable overall product.

Referring now to FIG. 4, the power device 10 is shown having its terminal leads 20a (20b–c not shown in side view) inserted through a spacer 34 which may be used in accordance with the present invention to facilitate the soldering of the power device 10 in the solder-wave process. Those skilled in manufacturing techniques can appreciate that the power device 10 (as seen in FIG. 2) may rest on its main body if the connection holes on the PC board 24a are sufficiently larger than the diameter of the terminal leads 20a–c. While this condition does not adversely affect the mounting technique of the present invention, it often impedes the wave soldering process since the terminal leads excessively protrude below the level of the PC board 22. Some process control engineers have preformed the terminal leads 20a–c of the power device 10 to create a "tripod" (or equivalent) to enable the power device 10 to "stand up". Another technique is to pretrim the terminal leads 20a–c such that they do not protrude into the wave-solder process. Of course, these techniques require prior handling and thus increase the manufacturing cost. Accordingly, an inexpensive spacer 34 may be used to position the power device 10 such that the terminal leads 20a–c do not overly protrude below the level of the PC board 22.

While only a particular embodiment of the invention has been described and shown, it should be understood that the invention is not limited thereto since many modifications may be made. It is therefore contemplated to cover by the present application any and all such modifications that may fall within the true spirit and scope of the basic underlying principles disclosed and claimed herein.

What is claimed is:

1. A method for mounting a power device residing on a geometrically shaped break-away area in a printed circuit board to a heat sink, comprising the steps of:
   (a) mounting the power device within the break-away area of the circuit board;
   (b) detaching the break-away area containing the power device; and
   (c) attaching the power device mounted in said detached break-away area to the heat sink.

2. The method of claim 1, wherein said mounting the power device comprises the steps of:
   inserting the power device into said break-away area;
   electrically connecting the power device to the printed circuit board with jumper wires; and
   soldering the power device and said jumper wires to the printed circuit board.

3. The method of claim 1, wherein said attaching step includes the step of insulating the power device from the heat sink before attachment thereof to said heat sink.

4. The method of claim 2, wherein the power device is inserted into said break-away area by hand.

5. The method of claim 2, wherein the power device is inserted into said break-away area by automatic insertion equipment.

6. The method of claim 2, wherein the power device and the coupling means are manually soldered to the printed circuit board.

7. The method of claim 2, wherein the power device and the coupling means are soldered to the printed circuit board using wave-solder equipment.

8. The method of claim 2, including the further step of placing a spacer means over the terminal leads of the power device prior to insertion in said break-away area.

9. The method of claim 1, which includes the step of installing the printed circuit board in a housing prior to the step of attaching.

* * * * *